United States Patent [19]

Eddy et al.

[11] Patent Number: 5,139,998

[45] Date of Patent: Aug. 18, 1992

[54] CONTROLLED THALLOUS OXIDE EVAPORATION FOR THALLIUM SUPERCONDUCTOR FILMS AND REACTOR DESIGN

[75] Inventors: Michael M. Eddy, Goleta; William L. Olson, Buellton; Timothy W. James, Goleta, all of Calif.

[73] Assignee: Superconductor Technologies, Inc., Santa Barbara, Calif.

[21] Appl. No.: 516,078

[22] Filed: Apr. 27, 1990

Related U.S. Application Data

[63] Continuation-in-part of Ser. No. 308,149, Feb. 8, 1989, which is a continuation-in-part of Ser. No. 238,919, Aug. 31, 1988, Pat. No. 5,071,830.

[51] Int. Cl.$^5$ ............................................. C01F 11/02
[52] U.S. Cl. ....................................... 505/1; 505/729; 505/783; 722/245; 722/247; 118/715
[58] Field of Search ........................... 505/1, 729, 783; 422/245, 247; 156/603, DIG. 73; 118/713

[56] References Cited

U.S. PATENT DOCUMENTS

| | | | |
|---|---|---|---|
| 3,925,147 | 12/1975 | Kimura | 156/603 |
| 4,636,280 | 1/1987 | Nakai et al. | 156/603 |
| 4,737,232 | 4/1988 | Flicotein et al. | 156/612 |
| 4,762,576 | 8/1988 | Wilson et al. | 156/611 |
| 4,820,651 | 9/1989 | Prince et al. | 156/DIG. 73 |
| 4,828,648 | 5/1989 | La Chapelle et al. | 156/611 |
| 4,870,052 | 9/1989 | Engler et al. | 501/123 |
| 4,929,594 | 5/1990 | Gopalaknishnan et al. | 505/783 |
| 4,939,308 | 7/1990 | Maxfield et al. | 156/603 |
| 4,962,083 | 10/1990 | Hermann et al. | 423/604 |

FOREIGN PATENT DOCUMENTS

| | | | |
|---|---|---|---|
| 357509 | 3/1990 | European Pat. Off. | 505/783 |
| 2-38302 | 2/1990 | Japan | 505/783 |

OTHER PUBLICATIONS

Kikushi et al., "Synthesis and Superconductivity of a New High-Tc Tl-Ba-Ca-Cu-O Phase", Japanese Journal of Applied Physics, vol. 27, No. 6, Jun. 1988 pp. L1050-L1053.

Primary Examiner—Robert Kunemund
Attorney, Agent, or Firm—Lyon & Lyon

[57] ABSTRACT

Methods and reactors are described for the production of thallium cuprate based high temperature superconductor films on a variety of substrates. The reactors provide for low volume cavities, means for rapidly heating and cooling to and from a predetermined elevated temperature and control of the thallium oxide overpressure during the processing. Uniform high temperature superconducting films are obtained while inhibiting reaction between the substrate and superconducting film during the processing.

13 Claims, 6 Drawing Sheets

CONTROLLED THALLOUS OXIDE EVAPORATION FOR THALLIUM SUPERCONDUCTOR FILMS AND REACTOR DESIGN

CROSS-REFERENCE TO RELATED APPLICATIONS

This application is a continuation-in-part of application Ser. No. 308,149, filed Feb. 8, 1989, which is a continuation-in-part of pending application Ser. No. 238,919, filed Aug. 31, 1988, U.S. Pat. No. 5,671,830.

INTRODUCTION

1. Technical Field

The field of this invention is the production of thallium high temperature superconductor films.

2. Background

After the initial excitement of being able to produce high temperature superconductors, namely materials which are superconducting above the vaporization temperature of nitrogen, the problems of producing these materials in useful form have become only too evident. Among the cuprate compositions which are particularly interesting because of their high superconducting transition temperature are the thallium compounds. These compounds are particularly difficult to prepare because of the nature of thallium oxides. $Tl_2O_3$ is unstable, so that at the elevated processing temperatures normally employed, it decomposes to $Tl_2O$ and $O_2$. In order to maintain the thallium present in the oxide mixture used to form the superconductor, it is necessary to control the amount of thallium in the vapor phase and in the liquid phase of the oxide composition. Among the other difficulties with processing thallium is that thallium is highly reactive, so that reactors which are employed must take into account the reaction of the structural materials with thallium. One is therefore confronted with working with a highly reactive material which can exist in both the vapor and liquid phases simultaneously at elevated temperatures, while trying to control the distribution of the thallium between the liquid and vapor phases in order to obtain the appropriate composition for a high temperature superconductor.

For many applications, one wishes to have a thin high temperature superconducting film on a substrate. Among the substrates are magnesium oxide, lanthanum aluminate and sapphire. For microwave device development, sapphire has many advantages including extremely low loss tangent at low temperature, availability in large area substrates, low cost and general acceptance as a microwave substrate. In addition, for low loss films on sapphire, several orders of magnitude improvement in the Q of a microwave device can still be achieved as high temperature superconducting films are improved. However, formation of thallium high temperature superconducting films on sapphire are subject to reaction and formation of barium or strontium aluminate compounds as second phases.

There is substantial interest in being able to produce thallium cuprate high temperature superconducting films and a wide variety of substrates for production of microwave and millimeter wave applications. It is therefore of interest to provide processes and reactors which will allow for the controlled and reproducible production of high temperature superconducting films on substrates of interest for the production of devices.

Relevant Literature

Ginley and co-workers at Sandia National Laboratories recently reported the preparation of superconducting thin films of the 2122 thallium compound ($Tl_2,Ca,Ba_2,Cu_2,O_8$). Jim Kwak at the same laboratory has reported polycrystalline thallium based films on yttria stabilized zirconia. Their films were prepared on yttria stabilized zirconia substrates by sequential e-beam evaporation of the individual metals on the substrate, followed by a post deposition reaction step in a closed platinum crucible. The films that were obtained were unoriented and exhibited a transition temperature of 97 K. IBM has reported preparing oriented thin films of the 2223 and 2122 compounds by rf diode sputtering.

A large number of articles have been published concerned with the thallium compounds. Illustrative of these articles are Sheng and Hermann, *Nature*, (1988) 332:55-58; Sheng and Hermann, *Nature*, (1988) 332:138139; Ginley et al., *Physica C*, (1988) 152:217-222; *Superconductor Week*, Vol. 2, No. 18, May 9, 1988, reported that Sandia had prepared unoriented polycrystalline Tl thin films that have reached critical current densities of 110,000 A/cm$^2$ at 77 K with a $T_c$ at 97 K. In the presence of a high magnetic field (6 Tesla), a critical current density of $1 \times 10^6$ A/cm$^2$ at 4 K was observed.

Venkatesan et al., *Appl. Phys. Lett.* (1988) 52:1193-1195, and Wu et al., *Proceedings of SPIE Symposium on High $T_c$ Superconductors*, Newport Beach, CA March 1988, report the use of pulsed laser deposition for preparation of high $T_c$ superconducting thin films. Venkatesan et al., and Wu et al., supra claim to have achieved YBaCuO films that are superconducting after deposition at 650° C., followed by oxygen annealing at 450° C. Witanachchi et al., (*Appl. Phys. Lett.*, in press) report that with the addition of DC bias plasma during laser ablation of high $T_c$ superconducting YBaCuO thin films, in situ superconducting films can be achieved at substrate temperatures as low as 400° C.

SUMMARY OF THE INVENTION

Methods and reactors are provided for the production of thallium cuprate high temperature superconducting films on a wide variety of substrates, by providing for controlled heating, short term maintenance at a high temperature, and rapid cooling, where the oxide layer is maintained in a small volume vessel, which allows for rapid equilibrium between the film and vapor. The reactor comprises: (1) a cap defining a small volume covering the reactants for formation of the high temperature superconducting film, where the cap may be coated with a source or sink for thallium; (2) a substrate on which the reactants are coated enclosing the vapor region; (3) susceptors for controlling the rate of heating and cooling; and (4) a spacer between the cap and substrate. In addition, means may be provided for independent pressure control in the region of the thallium vapor. By employing the subject heating profile and reactors, high temperature superconducting films on a variety of substrates may be reproducibly obtained.

BRIEF DESCRIPTION OF THE DRAWINGS

FIGS. 4a through 4d are plan views of components of the reactor according to FIG. 3, while

DESCRIPTION OF SPECIFIC EMBODIMENTS

Figure 1:
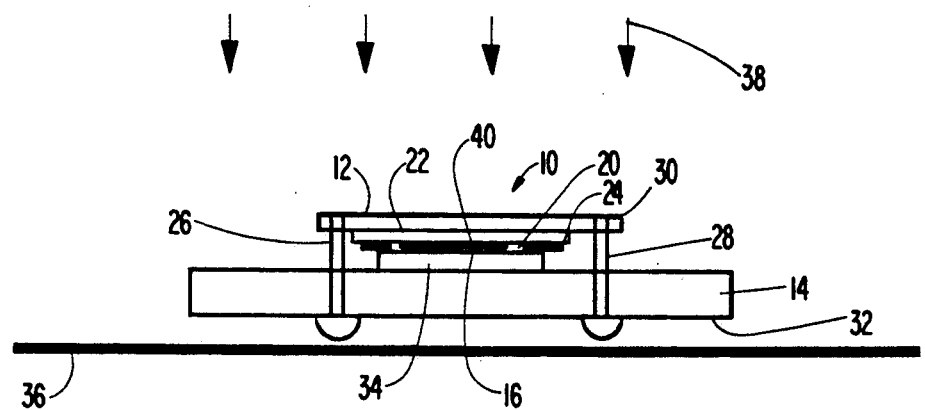
FIG. 1 is a diagrammatic elevational side view of a reactor.

Methods and apparatuses are provided for the reproducible production of high temperature superconducting thallium based cuprate films on a wide variety of substrates. The methods employ apparatuses which allow for rapid increase in temperature to a predetermined elevated temperature, short term maintenance at the predetermined temperature and rapid cooling substantially below the predetermined temperature. In addition, the apparatuses are designed to maintain controlled thallium oxide and oxygen pressures over the film forming composition, whereby formation of the superconducting composition occurs with precipitation of the superconducting film from a melt. The resulting products comprising the high temperature superconductor thallium cuprate based films on a variety of substrates find use in microwave and millimeter wave devices, where high superconducting transition temperatures, low surface resistance on low loss tangent substrates, such as MgO, $LaAlO_3$, $LaGaO_3$, or sapphire, and short penetration depths are necessary or desirable.

The films provided for in this invention are comprised of thallium, calcium, barium and copper oxides. The stoichiometry may include 2021, 2122, 2223, or such other stoichiometries as may provide for superconductivity. The films will be oriented films, so as to have a substantially uniform crystallinity. The films may be comprised of a single crystal or a plurality of crystals joined at their grain boundaries. The films will be highly oriented with the c-axis substantially normal to the surface of the substrate as demonstrated by X-ray analysis or electron beam channeling techniques. For the most part, single phase films will be obtained, although as desired, mixtures of two of the phases or related phases may be achieved within the film. For some applications, polycrystalline films may be prepared. Depending on the substrate, epitaxial films may be obtained.

The thickness of the film may be controlled. The film may be as thin as one layer, where the layer includes all of the necessary planes to obtain superconductivity, generally from about 30–50 Å or may be as thick as two micrometers or greater, depending upon the particular application. Thin films may be conveniently prepared by initially preparing a thicker film and then reducing the thickness, e.g., by ion milling. The thickness of the film is primarily a practical consideration, rather than a significant limitation of the procedures employed depending upon the characteristics for current density and penetration depth.

For many uses, a fraction of a micrometer thickness will be employed, generally in the range of about 0.1–1 $\mu$m. The film will have a superconducting transition temperature of at least 75 K, more usually 90 K, preferably at least about 100 K, more preferably about 115 K, and particularly preferred at least about 122 K, where the transition temperature has so far been substantially less than about 150 K. 2122 composition films can be achieved with a $T_c$ of at least 105 K and can be 110 K or higher and 2223 films with a $T_c$ of at least 110 K and can be 122 K or higher. The superconducting transition temperature should be as high as feasible, though in some situations one parameter may be compromised for another parameter. For the most part the films will be used at temperatures in the range of about 60–100 K.

The films will usually have critical current densities at 77 K of at least about $10^3$ A/cm$^2$, usually at least about $10^6$ A/cm$^2$. For microwave and millimeter wave applications, the surface resistance or impedance will generally be less than about $10^{-3}$ Ω, more usually less than about $10^{-4}$ Ω, at 10 GHz and at a temperature above 50 K, preferably above about 75 K.

The films will be substantially free of contaminants, having less than about 10 wt. %, preferably less than about 5 wt. % of material which is not superconducting.

The films will be of high quality as demonstrated by low lattice fault densities. By low lattice fault density is intended a sufficiently low fault density to demonstrate the intrinsic superconducting physical transport properties and sufficient to achieve essential device property requirements. In addition, smooth surface morphologies can be achieved as well as uniform thickness. See Forsyth, *Science* (1988) 242:391-399, for a description of surface morphology of $Nb_3Sn$ superconductors and the effect on electromagnetic properties.

The films will have a surface dimension in the a,b plane of at least about 0.1 mm, usually at least about 0.2 mm, and may be as large as 6 cm or more as the smallest surface dimension, particularly the diameter of a circle or the diagonal of a rectangle.

A wide variety of substrates may be employed, such as magnesium oxide, lanthanum aluminate, lanthanum gallate, lanthanum strontium aluminate, sapphire, buffered sapphire, metals, such as Ag, Au, Pt, or other reactive or inert substrates. The subject method finds particular application, with reactive substrates, where the processing allows for minimal reaction between the high temperature superconductor precursor layer and the substrate.

The method comprises forming a film of thallium, calcium, barium and copper ions in an oxide matrix by any convenient technique. Particularly, sol-gel or laser ablation technique as described in U.S. application Ser. No. 308,149, filed Feb. 8, 1989, may be employed. Other techniques include thermal evaporation, liquid phase epitaxy, electron beam or magnetron sputtering, and chemical vapor deposition.

Liquid phase film formation involves heating a deposited film to form a liquid coat on a substrate, where upon cooling of the melt, or other techniques, the metal oxide mixture crystallizes from the liquid onto the substrate surface to form the epitaxial superconductor layer. A liquid composition can be formed with Tl oxide, by itself or in combination with calcium oxide, as the solvent, with the other oxides becoming dissolved in the Tl oxide-containing liquid at an elevated temperature and subsequently crystallizing with the correct stoichiometry. Upon cooling, evaporation of the solvent, or chemical precipitation, the metal oxides crystallize to form a crystalline superconductor layer. Depending upon the substrate, the layer may also be epitaxial. One need not use the oxides initially, but can use metal compounds which may serve as the source of the metals in the liquid phase, where the counterions and conditions result in the formation of the desired oxide.

Coating of the substrate may be achieved in a variety of ways. One technique is to use chemical precursors, which upon pyrolysis may provide the desired oxide as a coating. Another technique is to employ a liquid comprising a sol of the metal oxides having an appropriate stoichiometry for production of the superconductor. Other techniques have been indicated, which involve vapor phase deposition. The first technique to be considered will be employing metallo-organic precursors to produce the oxides.

A sol composition is prepared employing metal soaps providing for the appropriate stoichiometry. The soaps will be carboxylates of at least about 6 carbon atoms, preferably at least about 8 carbon atoms, and usually not more than 16 carbon atoms, more usually not more than 12 carbon atoms. Conveniently, the 2-ethylhexanoates have found use, although neodecanoates, or other branched chain, particularly alpha-branched chain fatty acids may be employed. The metal soaps are prepared in accordance with conventional procedures. The soaps are dispersed in an appropriate medium, particularly hydrocarbons or halohydrocarbons boiling in the range of about 40° C. to 100° C., such as chloroform, toluene, xylene, benzene, methylenedichloride, etc., and the mixture made homogeneous by agitation, for example shaking, for several hours. Adjuvants may be added, such as thickeners, e.g. polysaccharides or ultra-high molecular weight polymers. The resulting solution and/or dispersion is then coated onto the substrate.

Coating can be achieved by putting the viscous sol onto the surface to be coated and spinning the surface by centrifugation for a short time to ensure the substantially uniform distribution of the film. Alternatively, the substrate may be dipped into or sprayed with the dispersion, protecting those areas of the substrate which are not to be coated. Any technique which allows for substantially uniform coating of the film on the substrate may be employed.

The coated substrate is then pyrolyzed for a short time at an elevated temperature, generally in the range of about 150° C. to 500° C., preferably in the range of about 150° C. to 300° C. Tl volatilization can occur at temperatures as low as 100° C., so short process timing and Tl overpressures and oxidizing atmospheres are employed to control phase formation and to limit Tl loss and minimize formation of undesired second phases in the film. The pyrolysis time and temperature should be selected to substantially ensure decomposition of the fatty acids, so as to leave a thin film of metal oxides, the pyrolysis occurring in the presence of oxygen, conveniently air. The procedure may be repeated as many times as desired, in order to enhance the thickness of the metal oxide film.

Desirably, each subsequent pyrolysis may be carried out at a lower temperature than the initial pyrolysis, where the initial pyrolysis is carried out in the upper portion of the temperature range, 250°-450° C., and the subsequent pyrolysis are carried out at a temperature in the range of about 200°-350° C. Usually, at least about 60% of the volatile organic material is removed and by extending the heating period, a constant weight can be realized. Care must be taken to minimize thallium volatilization when pyrolysing above 300° C.

The film, deposition and pyrolysis procedure will be carried out at least once, more usually twice, and may be five times or more, usually not more than about four times.

The thickness of each layer will depend upon a number of parameters: the viscosity of the sol, the time for spinning, the revolutions per minute, the temperature at which the substrate is spun, and the like. Where other techniques are used to provide the coating, such as dipping, spraying, spreading with a blade, or the like, different parameters may be involved.

A second preferred procedure for preparing the subject films employs laser ablation. Laser ablation can be used either to coat the substrate at room temperature in preparation for the thermal process described above, or can be used to deposit and form the superconducting phase in one step at elevated temperature.

In accordance with this invention, laser ablation is achieved by preparing an appropriate target. The apparatus for the most part, is conventional and is described in Wu et al, supra. A target is prepared by placing the appropriate composition of metals or metal oxides on the surface of a support which can be rotated at a controlled rate. The target on its support is placed in a vacuum chamber having a quartz window, where a laser beam of appropriate energy and wavelength impinges on the target causing a plume of ablated vapor normal to the target surface. The substrate is placed substantially normal to the direction of the plume, so as to receive the atoms in the plume, where the atoms bind to the surface of the substrate. The substrate is maintained at room temperature or at an elevated temperature depending on whether the goal is an amorphous or a crystalline deposit.

The laser ablation target can conveniently be made in the same manner as the sol-gel coating described earlier. Thus, a uniform film of the various carboxylates can be prepared and pyrolyzed as described previously to produce the desired oxide mixture. Pyrolysis can be carried out in the presence of oxygen, so as to ensure the formation of the desired metal oxides in their proper oxidation state. Alternatively, the target can be made from pressed and sintered powder or from hot pressed powder.

The laser energy density on the target will generally be from about 1-3 J/cm$^2$. Ideally, the film on the target will have the same metal molar ratio as the intended composition on the substrate. In practice, the deposit tends to be Tl poor relative to the target composition. The target will usually be of from about 0.5 to 10 in. in surface area and about 0.001 to 0.25 in. thickness.

The laser may be focused to cover various areas of the target. The laser may impinge upon the surface over a wide range of angles from a minimum of about 2° up to 90°. A typical impingement angle is about 25°. The area impinged by the laser will generally be at least about 2 mm$^2$ and not more than about 50 mm$^2$. A typical area is about 15 mm$^2$. The ratio of length to width will depend upon the angle of impingement, and will generally be at least 2 to 1, and not more than about 20 to 1, more usually not more than about 10 to 1. By employing an energy in the range of about 2 J/cm$^2$ per pulse, one can deposit about one monolayer, generally about 3Å thick onto the substrate with each pulse. By controlling the number of pulses per second, which would generally range from about 0.5 to 50, one can achieve an accretion on the substrate of about 0.1 $\mu$m/min.

The target will usually be relatively close to the substrate, usually not less than about 2 cm and not more than about 10 cm, preferably about 6 cm. Conventionally, the chamber will be evacuated to $1 \times 10^6$ and then backfilled to about 500 mTorr, preferably from about 2 to 200 mTorr, more preferably about 100 to 200 mTorr. Various inorganic oxidizing gases may be present, such as oxygen, air, hydrogen peroxide, ozone, nitrogen oxides, such as nitrous oxide or the like, where the inorganic oxygen source can be activated by virtue of the laser beam or an independent energy source. For example, an oxidizing gas source may be directed toward the layer on the substrate where the gas has been activated, for example, oxygen activated by passing through an electric field or laser.

The composition of the coating may vary as to the thallium, usually having at least about a "stoichiometric amount" of thallium. Thallium may be provided from a source of thallium in the reactor and be absorbed by the superconductor precursor composition or the additional source of thallium may reduce evaporative loss of thallium from the coating. With excesses of thallium in the coating the excess may be removed using a thallium sink, e.g., a calcium, barium, copper oxide composition, controlled leakage, or the like. Oxygen overpressures also serve to control the thallium evaporative loss.

Once the film has been formed, a relatively strict temperature regimen will be employed for the heating of the film to provide the proper composition for the high temperature superconductor film. Generally, controlled, uniform heating will be employed to achieve a predetermined temperature in the range of about 750° to 900° C., more usually about 800° to 875° C. The heating rate should be carefully controlled and uniform over the entire substrate. The heating rate controls two key film processing characteristics: a) degree of melting, and b) $Tl_2O$ evaporation rate from the film. The more rapid the heating rate employed, the more completely melting is observed. In extreme cases for very Tl rich deposit compositions, rapid heating rates will result in films with a splotchy appearance and poor substrate coverage. The rate of heating will usually be at least about 5° C./min, and may be as high as 200° C./min or higher, usually in the range of 5° to 40° C./min. The time for which the temperature is maintained will generally range from about 0.5–10 min, usually 1–8 min, preferably about 1–5 min. The temperature will then be dropped at a rate in about the same range as the rate of heating.

The heating regimen can be achieved in a variety of ways. Of particular interest is to use susceptors and a rapid thermal annealing device, using infrared heaters. By varying the size of the susceptors, the susceptors may act as temperature sources and sinks, first absorbing the heat, so as to rapidly raise the temperature and then acting as heat sinks to rapidly remove the heat from the substrate and film, depending on their location in relation to the heat source, relative size, contact with other heat conducting elements, and the like. The susceptors will generally be of a size in the range of 0.5 to 2" in diameter. The susceptors may be any of a variety of corrosion resistant [$O_2$] materials, such as steel, inconel, SiC coated graphite, polycrystalline aluminum, zirconia, etc.

The thickness of the film will generally be in the range of about 0.5 to 5 $\mu$m, while the film area will be in the range of about 0.5 to 5 mm. The volume of the cavity above the film will generally range from about $10^4$–$10^8$ $\mu m^3$. Desirably, the cavity will be in the range of about 200 to 500 $mm^3$. The height of the cavity will generally be from about 10 to 100 $\mu$m, preferably 15 to 60 $\mu$m. The surface opposite the film may serve as a thallium source or sink. That is, the opposite wall from the film may be comprised of thallium oxide, so as to contribute to a thallium overpressure in the cavity or may be a combination of two or more of calcium, barium and copper oxides, so as to absorb thallium released from the superconductor precursor film.

In addition, a conduit may be provided for connecting the cavity to a source of oxygen, thallium, or other gas or for changing, usually by reducing the pressure in the cavity and evacuating the cavity of volatile components in the cavity, such as thallium oxide and oxygen.

There are a number of parameters which can be varied in relation to the thallium and oxygen present in the film and the cavity. One can provide for excess thallium in the superconducting film precursor, as a film on the wall of the cavity, or by introduction of thallium oxide from an outside source. Alternatively, one may remove thallium oxide from the cavity by providing for a chemical thallium oxide sink on the walls of the cavity or by providing for a conduit into the cavity which allows for removal of thallium oxide from the cavity. In addition, one may vary the oxygen over pressure in the cavity, which will affect the volatility of thallium oxide in the film or source. Thus, by varying the thallium oxide in the cavity which will be directly related to the amount of thallium oxide in the precursor film, one can control the formation and composition of the high temperature superconducting film.

One may also provide for pellets comprising all or some of thallium, calcium, barium and copper oxides, which may act as sources or sinks of thallium oxide, which may be placed in a manner which allows for communication between the cavity and the pellets but preventing contact between the pellets and the superconductor film precursor. The various configurations will be discussed in relation to the various devices or apparatuses employed for the development of the high temperature superconductor films. After the appropriate superconducting composition is prepared, it may then be subjected to a thermal anneal. The parameters for the thermal anneal will be different from the preparation of the superconducting film. For the anneal, the superconducting film is rapidly heated to a temperature in the range of about 500° to 850° C., generally over a period of about 10 to 30 sec. The temperature will then be maintained, ±15% for a period of about 5 to 60 min, preferably from about 15 to 45 min in an oxygen atmosphere while in the presence or absence of a thallium source. The temperature for the source, if present, will be higher by at least about 50° C., preferably from about 100° to 150° C. higher than the superconducting film. The oxygen pressure can range between about 0.001 torr and 5000 torr. The temperature of the source will be heated analogously to the superconducting film, so that the ultimate temperature for the source is reached at or shortly after the temperature for the film is reached. The temperature for the source will be maintained substantially constant during the period of annealing and will then be allowed to cool, at about the same time and rate as the superconducting film, back to room temperature. Desirably, cooling of the source will begin shortly before the cooling of the superconducting film, usually from about 0.5 to 5 min prior.

The devices of the subject invention will have means for controlling the temperature profile of the process, so that rapid heating/cooling can be achieved with short term maintenance at the predetermined elevated temperature. In addition, means are provided for controlling the thallium oxide overpressure, which means may include controlling the oxygen overpressure, as well as providing for a source or sink of thallium oxide within the reactor cavity. In addition, the volume of the reactor cavity is controlled, so as to be only a small multiple of the volume of the superconducting film precursor and access to the cavity can be provided with means for introducing or removing the volatile components present in the cavity.

In a first embodiment in FIG. 1, the reactor 10 has a top plate 12 and a base plate 14 which serve as susceptors, conveniently being made of stainless steel or other similar refractory oxidation resistant material. The plates serve two purposes. First, the plates serve as an efficient reproducible susceptor material for controlling the temperature of the deposit during thermal processing. Secondly, by varying the relative size and thickness of the upper and lower plates, it is possible to produce a thermal gradient between a capping film, 22, which may serve as the thallium source or thallium sink and the deposited film 16 opposite from the capping film 22. The cavity 20 is enclosed by cap 22 and spacer foil 24. The cap 22 may be conveniently prepared using a single crystal magnesium oxide substrate. By chemically etching a well of the appropriate depth into the single crystal substrate using hot phosphoric acid, a cavity may be defined which will serve as the reactor area. Other materials which find use include sapphire, polycrystalline $MgO+Al_2O_3$. Conveniently, the sealing provided by the cap may be coated with the thallium source or sink 40. Usually, the depth of the cavity will not exceed about 20 $\mu m$, usually not being less than about 5 $\mu m$, conveniently about 10 $\mu m$.

The spacer foil should be of an inert material, conveniently a nobel metal, particularly gold. However, it is found that even gold will react with thallium oxide at elevated temperatures, so that the amount of gold exposed to the thallium oxide should be minimal. Usually, the spacer foil will be at a thickness of about 0.005 to 5 mils. The top plate 12 and the base plate 14 are firmly clamped together using stainless steel screws 26 and 28. Thermocouple 30 for the top plate and 32 for the bottom plate conveniently, are thermally sunk into the plates using indium. Also, all contacts are thermally sunk. The substrate 34 completes the enclosure of the cavity 20 in conjunction with the spacer foil 24 and the cap 22. The reactor may be introduced into an infrared source of heating, indicated by arrows 38.

The susceptor plates 12 and 14 are used to provide a thermal gradient which serves to engineer the thallium content of the thermally processed film by providing a strong driving force for either condensation or evaporation of thallium from the deposit during thermal processing. For example, if a $Tl_2O_3$ deposit is present on the top capping layer, the top part of the "sandwich" will heat first providing a source of thallous oxide vapor. Alternatively, if a Ca-Ba-Cu oxide composition was deposited o the capping substrate, this material would provide a strong chemical sink for condensing excess thallous oxide in the vapor, thereby providing a strong driving force for thallium evaporation from the film.

Given the limited volume of the atmosphere above, extremely high transport rates are achievable between the top and bottom film making up opposing ends of the reactor (distance between films may be as small as 0.005 inch). By appropriate selection of the mass of the two susceptor plates and the incident IR heating power, it is possible to maintain a controlled temperature gradient between the thallium source-sink deposits, thereby allowing excellent control over the evaporation/transport rate and crystallization kinetics of the superconducting phase.

Figure 2:
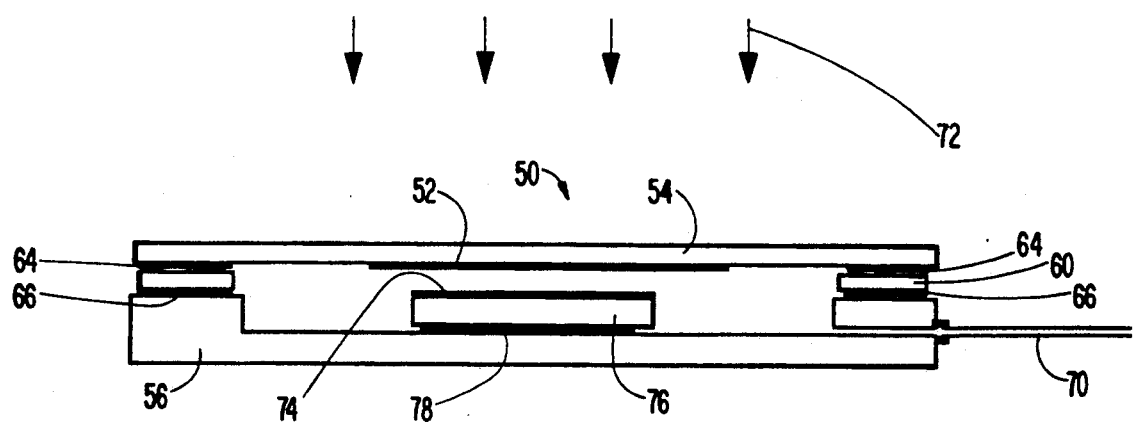
FIG. 2 is a diagrammatic elevational side view of an alternate embodiment of a reactor.

A modified design of the first reactor is depicted in FIG. 2. This reactor 50 has a thallium source/sink layer coated onto top plate 54. Top plate 54 is insulated from base plate 56 by a low thermal conductivity material spacer 60, conveniently polycrystalline zirconia. The spacer inhibits the amount of radiative heat transfer between the base plate 56 and the capping plate 54. Thus, spacers may serve as insulators between adjacent components of the reactor. The cavity area 62 is sealed using a pair of inert metal gaskets 64 and 66, e.g., gold or platinum wire. The sealed reactor is connected to a vacuum pump, not shown, via capillary tube 70. This connection allows the pressure of the vessel to be independently controlled and monitored, thereby reducing the possibility of gas expansion and seal failure during thermal processing. In addition, the use of a low thermal conductivity insulator between the source and sink plates of the reactor greatly facilitates the establishment of a controlled temperature gradient between the base plate 56 and the capping plate 54. Infrared heating is indicated by the arrows 72. If desired, separate sources of heat may be provided to the capping plate 54 and the base plate 56. Thermocouples may be used to monitor/control the temperatures of the thallium source/sink layer and the deposited film. The temperatures of the deposits are controlled by having the capping plate 54 and base plate 56 serving as susceptors which are thermally isolated from each other.

The capillary tube allows the thermal processing of the films over a wide range of oxygen pressures ranging from about 0.01-5000 torr. The capillary tube may also be used to leak-check the reactor to confirm the integrity of the metal gaskets. The reactor design allows for independent control of the process temperature, thallium oxide, and oxygen pressure during thermal processing, as well as providing the flexibility of adding an independent thallium source or sink that it can be maintained at a separate independently controlled temperature. The small volume in the cavity assures rapid equilibration between the various solid-liquid-gas species that are present within the reactor. The high temperature superconducting precursor film 74 is coated onto an appropriate substrate 76, which is thermally sunk to base plate 56 through thermal sink 78.

Figure 3:
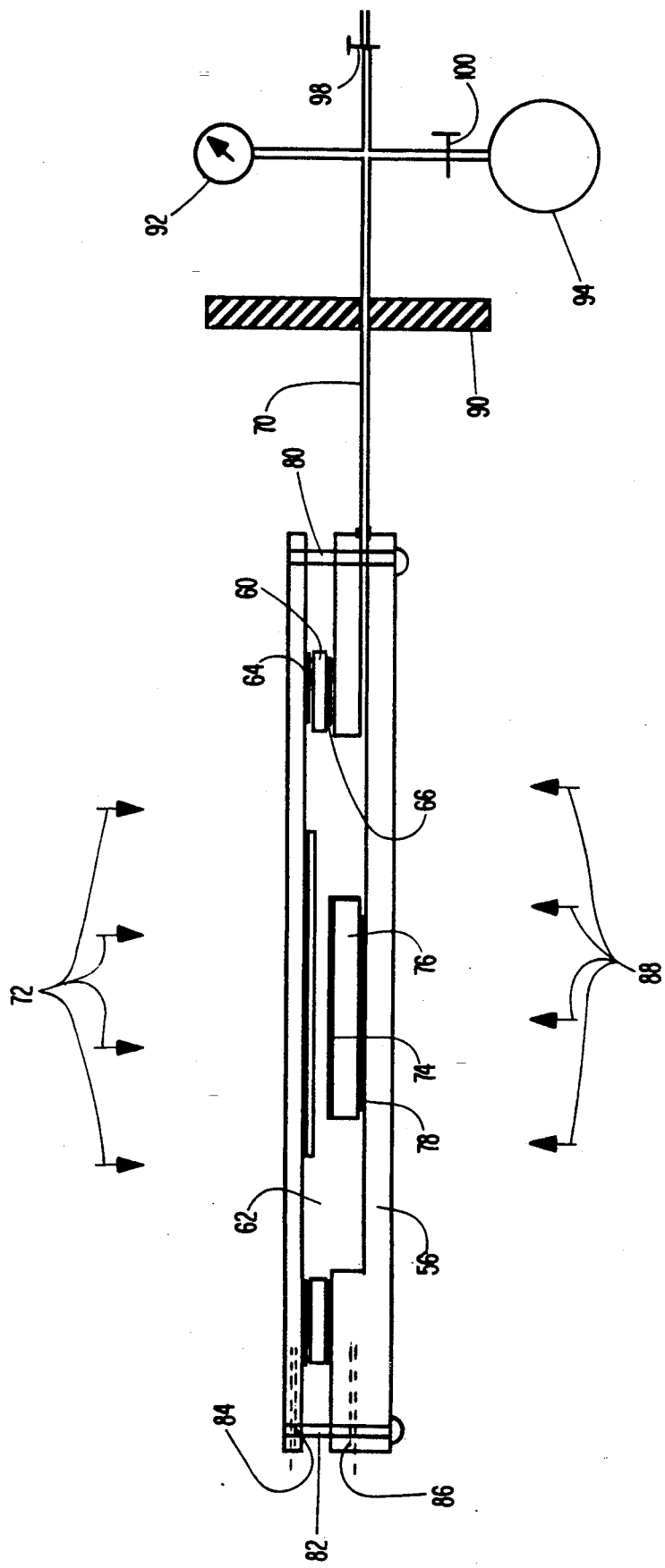
FIG. 3 is a side diagrammatic elevational view of an alternate embodiment of a reactor.
Figure 4A:
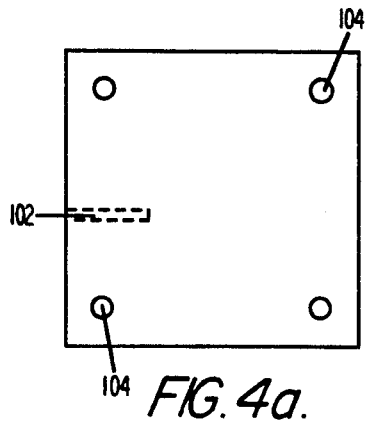
Figure 5A:
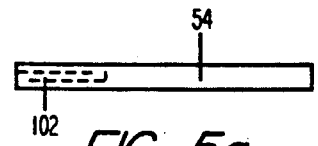
FIGS. 5a through 5d are side views of the components of the reactor according to FIG. 3.
Figure 4B:
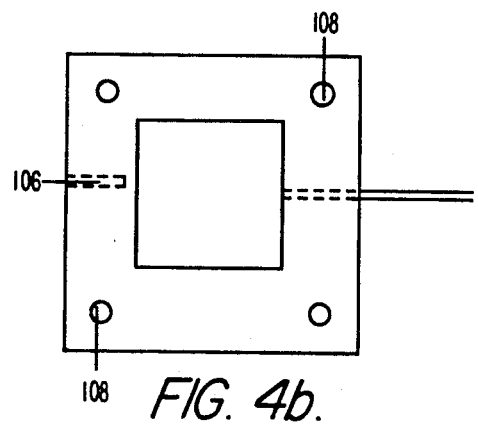
Figure 5B:
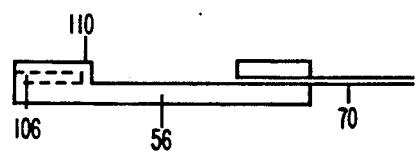
Figure 4C:
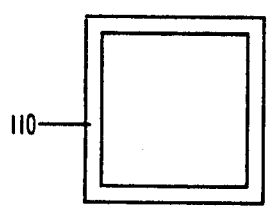
Figure 5C:
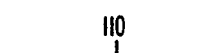
Figure 4D:
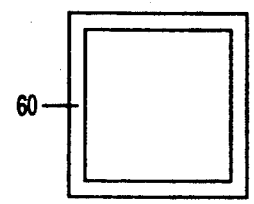
Figure 5D:
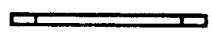

In FIG. 3, a modified reactor design is provided in somewhat greater detail than FIG. 2. In FIG. 3 the capping plate 54 and the base plate 56 are stainless steel and are sealed by means of thermally sunk stainless steel screws 80 and 82. Separating thallium source or sink 52 from superconducing precursor film 74 is a low thermal conductivity cover 53, of a material such as polycrystalline zirconia, which serves to inhibit the amount of radiative heat transfer between the base and capping stainless steel plates 54 and 56. Thermocouples 84 and 86 are provided for capping plate 54 and base plate 56 respectively. A second heating source 88 is provided for separate heating of the base plate 56 from the capping plate 54. The wall 90 of the rapid thermal annealing apparatus which provides the infrared heat is depicted through which capillary 70 extends to be connected to vacuum gage 92 and vacuum pump 94. The capillary is provided with vent 96 controlled by valve 98. Connection to the vacuum pump 94 is through valve 100.

In FIGS. 4 and 5 are depicted various component parts of the reactor in plan and side views. The top plate has cavity 102 for receiving thermocouple 84, as well as channels 104 symmetrically situated near the four corners of top plate 54 for receiving stainless steel bolts 80 and 82. Base plate 56 has cavity 106 for receiving thermocouple 86 as well as channels 108 for receiving bolts 80 and 82 for sealing the cavity. Base plate 56 is stepped, so as to define wall 110, which encloses a portion of the cavity and with the gasket 64 and 66 and spacer 60 defines the volume of the cavity. A gold foil gasket 110 serves as the metal gasket 64 and 66 in FIG. 3. Finally, the thermal isolation spacer 60 completes the barrier surrounding the cavity 62.

The device may be readily assembled by placing the substrate 76 coated with the superconductor precursor film 74 onto the base plate 56, followed by mounting the gasket 76, the thermal isolation spacer 60 and the gasket 64 respectively. The capping plate 54, coated with a thallium source or sink, as appropriate, is then placed onto gasket 64 and stainless steel bolts 80 and 82 introduced into channels 104 and 10 for sealing. Thermocouples 84 and 86 then may be introduced into their appropriate cavities and the reactor introduced into a rapid thermal annealing housing for processing of the superconductor film.

Figure 6:
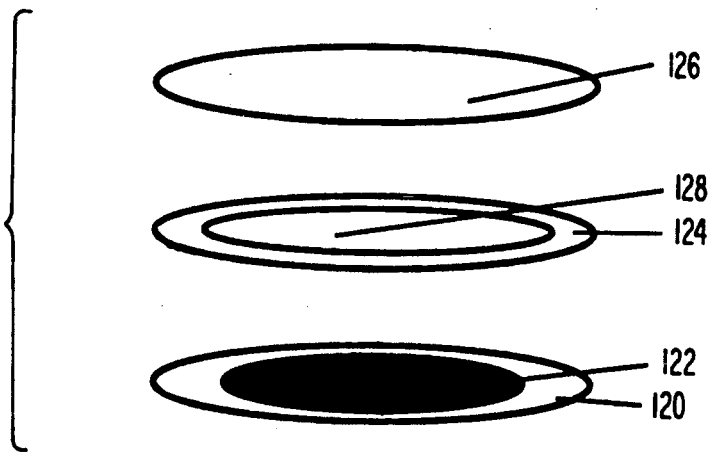
FIG. 6 is a diagrammatic elevational side view of an alternate embodiment according to this invention.
Figure 7:
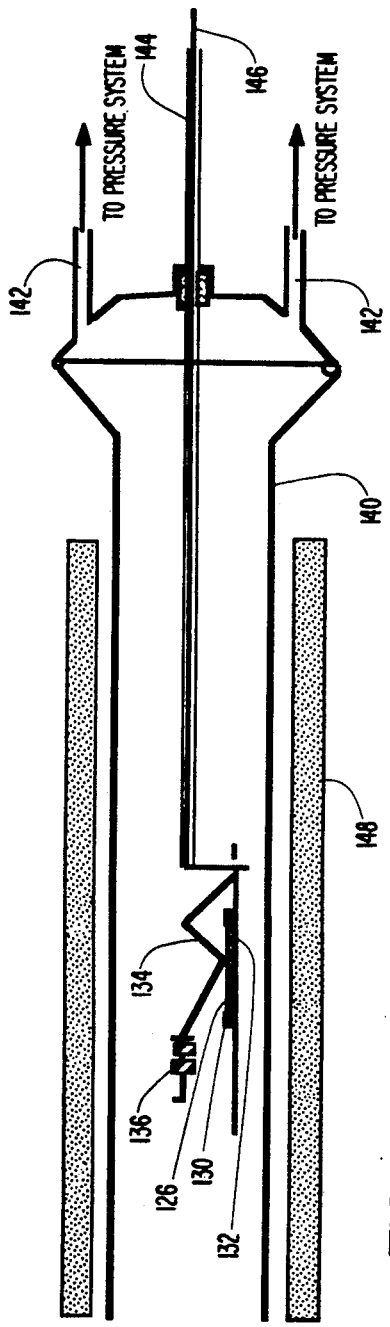
FIG. 7 is an exploded view of reactor components according to the reactor of FIG. 6.

An alternative design is depicted in FIGS. 6 and 7. In this reactor, the reactor may be constructed out of high quality sapphire substrates. Three or more substrates may be employed: a base substrate 120 having the superconducting film precursor 122 deposited onto the surface of the base substrate; a double-side polished spacer 124 is supported by the base substrate 120 and encircles the film 122; and a top wafer 126 encloses the cavity 128 defined by spacer 124. The thickness of the spacer will typically vary between 15–40 mils. The film 120 can be conveniently deposited directly upon the base wafer 120, for example using laser ablation and a circular shadow mask. With a spacer of 40 mil thickness, the distance between the bottom and capping substrates is sufficient to allow 1 cm square substrates of intermediate thickness (15 mil) within the cavity.

Prior to the thermal processing run, each sapphire substrate is carefully cleaned in hot sulfuric acid/hydrogen peroxide and lapped to ensure a close fit between the various wafers making up the structure. One can monitor the quality of the seal between the wafers by checking for interference fringes when the wafers are pressed together. The failure to observe 2-5 interference fringes around the entire periphery of the reactor indicates lack of proper fit.

In a typical run, the circular reactor 130 defined by the wafers 120, 124 and 126 is placed on a quartz sled 132. A lever on 134 is brought down to rest upon the upper wafer 126. Weights 136 are placed on the lever arm 134 in order to control the amount of pressure applied to the wafers making up the reactor 130 and the entire assembly is placed inside a 1.5 inch diameter sealed quartz tube 140. The quartz tube is sealed and repeatedly evacuated through conduit 142 and filled with oxygen to a predetermined pressure, generally ranging from about 10–760 torr. The pressure may be measured using a digital read-out on a MKS barometer.

The furnace is heated to 860° C. prior to introducing the sample. The sample is then slid into the center of the furnace using a quartz push rod 144 or the furnace is programmed to control the heating rate. The temperature of the sample is monitored using a thermocouple 146 located within the quartz push rod 144. The heating rate when the sample is pushed in is about 200° C./min up to 700° C./min and then 50° C./min from 700° C. to 860° C. The programmed heating rate is about 100° C./min up to 700° C., and then 1°-50° C./min up to 860° C.

The sample quickly reaches a process temperature of 860° C., where it is held for 0.5-8 min before being quickly (10–20 min) cooled to room temperature. The total system pressure can be easily programmed using an appropriate vacuum/oxygen manifold. A typical process experiment involves programming the oxygen pressure within the reactor from 760 torr to 110 torr after the sample reaches 860° C. The evacuation rate is empirically determined by varying the leak rate to the vacuum pump using appropriate valve means. Selected pump down times can vary in duration but normally require approximately 45 sec to complete.

Superconducting thallium films exhibiting uniform composition and morphology are routinely obtained with this reactor design. Over the course of 70 experiments, a number of modifications have been employed directed toward improving reproducibility. The basic approach is to heat a thallium rich 8223 Tl:Ca:Ba:Cu oxide precursor to a temperature close to or above its melting point and to control phase formation by controlling the Tl evaporation rate from the resultant liquid phase.

The formation of liquid phase is dependent upon the thallium stoichiometry of the deposit, and the temperature and oxygen partial pressure above the material. For example, an 8223 deposit under 1 atm of oxygen pressure will melt at a temperature of 860° C. Under the appropriate process conditions, a homogenous melt is obtained which rapidly looses a small amount of thallous oxide and oxygen to reach equilibrium with the surrounding atmosphere. The amount of free volume above the film can be easily varied to take into account variations in the deposit thickness and thallium stoichiometry. When processing films with the initial composition near the desired final film stoichiometry of approximately 2223, the free volume above the film is minimized by inserting an additional sapphire or magnesium oxide substrate into the reactor to fill the unused volume. When materials are inserted into the reactor cavity to reduce the overall volume, they are generally placed below the substrate on which the film is deposited.

Six principal methods may be used to control the rate of thallous oxide vaporization from the deposit which occurs during thermal processing. The first involves changing the amount of empty volume present in the cavity. This can be controlled by varying the thickness of the spacer or by placing inert spacers to take up excess volume in the reactor. A second method involves increasing the process temperature to increase thallium volatilization. A third method is to change the overall oxygen partial pressure during a particular time-temperature process sequence. Since oxygen actively suppresses volatilization of thallous oxide, lowering the total system pressure is an effective mechanism for increasing thallium volatilization at any given temperature. A fourth method is to vary the spacing between the individual substrate layers that make up the walls of the reactor. The greater the spacing between the substrates, the greater thallium evaporation rate from the film. For example, if the sapphire reactor wafers are fitted tightly together, either by use of inconel clips or heavy weights placed on the lever arm, loss of thallium from the film is extremely small, even when held at 860° C. in one atm of oxygen for reaction times of 8 min or more. On the other hand, if the cap is omitted from the reactor, and the film heated in an open crucible, thallium completely evaporates in a few seconds. A fifth method for controlling thallium oxide vaporization is the rate of heating. The faster the rate of heating, the more liquid thallium oxide present and the greater the amount of vaporization. The sixth method involves the hold time and the elevated temperature. The greater the hold time, the more thallium oxide is vaporized and lost.

In the next design, the design is created with the purpose of fabricating a controlled diffusion barrier for the reactor that can be reproducibly constructed and readily modified to control the thallous oxide evaporation rate from the confined space above the film. This is accomplished by first drilling a hole into the top wafer. The hole in turn is covered with a large flat piece of sapphire into which has been carefully milled a channel of well defined width, length and depth. The trench in the sapphire cap is placed directly over the hole in the top wafer of the reactor and the entire assemblage tightly held together. Satisfactory results have been obtained using grooves that are approximately 500 $\mu$m deep and 200 $\mu$m wide. The groove provides a reproducible well defined diffusion leak for evaporative loss of thallous oxide from the melt during thermal processing.

Figure 8:
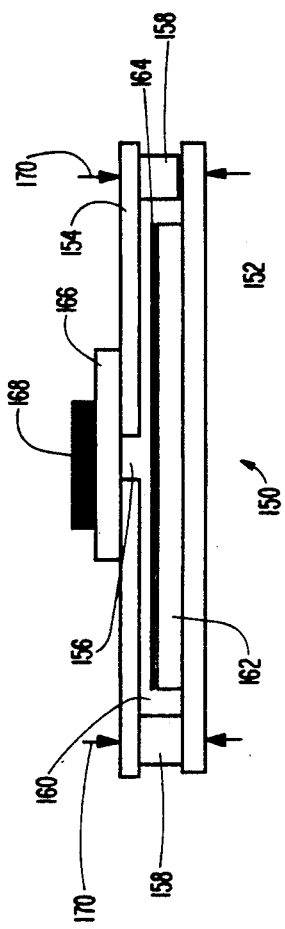
FIG. 8 is a diagrammatic elevational side view of an alternative embodiment of the reactor of FIG. 6.
Figure 9:
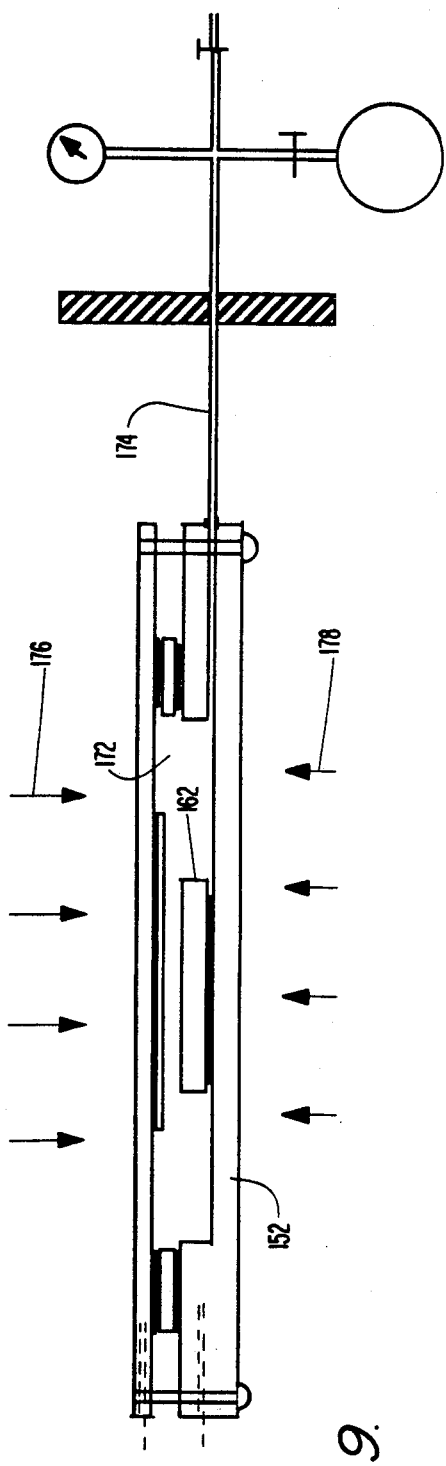
FIG. 9 is a diagrammatic elevational side view of an alternate embodiment of the reactor FIG. 6.

The device is depicted in FIGS. 8 and 9. The reactor 150 has base plate 152, top plate 154, with orifice 156 in top plate 154. Spacer 158 separates base plate 152 and 154 and defines the volume of the cavity 160. Substrate 162 sits on base plate 152 and is coated with the superconductor precursor film 164. Grooved cap 166, providing a diffusion leak channel, not shown, covers orifice 156 and is held in place by weight 168, although clips may also be used. The assembly of plates 152, 154 and spacer 158 are held together by clips 170.

In FIG. 9, the reactor 150 is depicted, where a thinner substrate 162 is employed, the reactor is placed in a controlled pressure chamber 172 connected to a vacuum manifold through conduit 174, preferably constructed of a large inside diameter stainless steel tube. Infrared heating is depicted by arrows 176 and 178, which heat upper plate 154 and lower plate 152, respectively.

Oriented superconducting thin films have been prepared with magnesium oxide and lanthanum aluminate substrates using this reactor design. In one set of conditions, process conditions include rapidly heating the film positioned inside the sapphire reactor to 860° C. and holding at that temperature for 2–8 min. At high oxygen pressures (3 atm), melting of the film is suppressed and thallous oxide vaporization from the deposit is virtually zero. At oxygen overpressures near 1 atm, a rapid reproducible loss of thallous oxide from the film occurs to give a superconducting thin film exhibiting a $T_c$ above 80 K and an XRD pattern that agrees well with published reference spectra for the 2122 compound. In one instance, an epitaxial thin film on lanthanum aluminate was obtained that exhibited a scaled 10 GHz surface resistance of 8 m$\Omega$ at 77 K.

On magnesium oxide, the superconducting film may or may not nucleate uniformly on the substrate, where non-uniformity results in non-continuous superconducting films with a "splotchy" appearance. Similar observations had been made for 2223 thin films processed on magnesium oxide previously using an open gold pouch process. With magnesium oxide, therefore, portions of the film are isolated which provide for a spacer 3 mm thick, and a uniform thickness and morphology. For 8223 films thermally processed on lanthanum aluminate substrates, the nucleation density and substrate coverage appears to be better than for comparable films on magnesium oxide. An X-ray diffraction curve of a 1 $\mu$m thick 2122 film on lanthanum aluminate prepared in the small volume controlled pressure reactor was obtained. The as-deposited film was 1.8 $\mu$m thick with an approximate composition of 8223. The film after thermal processing was highly c-axis oriented with the majority of the (001) reflections saturating the detector. A rocking curve on the weakest detected (001) reflection indicated the film was highly c-axis oriented with a FWHM of 0.5°. Electron beam channeling of the film both in plan view and cross-section confirmed that the superconducting thin film was epitaxial, with the latter technique indicating the existence of an extremely sharp, well defined interface between the film and substrate. The film was homogenous in its composition and morphology and was devoid of any composition or morphological gradients. Temperature dependent resistivity curves indicated the material to be superconducting with a transition temperature of 98 K. The film exhibited an extremely sharp AC susceptibility transition with a very narrow transition (0.5) width. The 10 GHz surface resistance of the film at 77 K was 1.5 m$\Omega$, which is slightly better than OFHC copper at this temperature and frequency.

In the following preparations, deposit was by laser ablation from a target produced by Alcan as a high density tablet, which is found to give a more uniform deposit than porous targets. The conditions for the laser ablation and deposit were laser energy, 3.4 J/cm$^2$; deposition time, 25 min; substrate, LaAlO$_3$ (AT & T) O$_2$ pressure, 5 mtorr; target stoichiometry, 8223.

The small volume reactor used consisted of a substrate 5×5 mm. An inconel pipe was used as the reactor vessel. The reactor was pushed into the hot zone at a speed to give a heating rate of 30° C./min. The process parameters were: final T°C., 854,; hold time, 2 min; O$_2$ pressure, 760 torr; thickness 1.5 $\mu$m. The transport properties of the film were: Rs (77 K scaled to 10 GHz), 0.3 m ohms; $T_c$(0), 95 K.

The next experiment was substantially the same as above except that the laser energy was 3.0 J/cm$^2$ and the deposition time was 35 min for preparing the deposit. For processing the deposit, the heating rate was programmed into the furnace. The sample was a 1 cm$^2$ LaAlO$_3$ substrate with a 6.5 mm$^2$ deposit in the center of the substrate. The process parameters were: final T°C, 855° C.; hold time, 2 min; O$_2$ pressure, 760 torr; thickness, 1.3 $\mu$m.

The following table indicates the results obtained in other runs. The target was 8223 (Tl/Ca/Ba/Cu mole ratio), except where otherwise indicated.

TABLE 1

| | Depositions | | | | | Process Parameters | | | | | |
|---|---|---|---|---|---|---|---|---|---|---|---|
| Run # | Laser Energy J/cm$^2$ | Substrate Composition | Substrate Supplier | $P_{O_2}$ mtorr | Target Stoichi- ometry | Final T °C. | Hold Time min | Thickness μm | $P_{O_2}$ torr | Rs (100 GHz, 77K) mohms | $T_c(0)$ | Product Stoichi- ometry |
| 645 | 2.5 | MgO | ESPI | 5 | 8223 + Tl | 860 | 5 | 0.7-8223, 0.2 Tl | | | | |
| 643 | 2.7 | MgO | ESPI | 5 | 8223 | 860 | 2.5 | 0.7 | | | | |
| 621 | 3.5 | MgO | ESPI | 5 | 8223 | 860 | 2.5 | 0.4 | | | | |
| V45 | 4.0 | LaAlO$_3$ | | 5 | 8223 | 850 | 4.0 | 0.4 | 150 | | | |
| 242 | | LaAlO$_3$ | | | | 850 | 2 | 1.2 | 760 | | | |
| 262 | | LaAlO$_3$ | | | | 850 | 2 | 1.2 | 760 | 59 | 97 | 2122 |

645 - The configuration differed from FIG. 1, in that the top plate was removed, to heat directly through the sapphire window, and an additional Tl overlayer was deposited to compensate for the initial loss of Tl.
643 - The configuration was the same as FIG. 1. The Tl source was provided by spinning a thin layer of Tl 2-ethylhexanoate onto the top sapphire wafer, which was heat sunk to the top plate with a thin (0.002 mm) gold foil.
621 - The configuration was the same as FIG. 1. The substrate was thermally bonded to the base using a Ca/In mixture.
645 - The configuration was the same as FIG. 7. The quartz tube was placed in a 1" tube furnace.
242 - The configuration was the same as FIG. 7. The film had an initial density of 1 × 10$^6$ A/Cm$^2$ at 77K. The crystal quality was excellent as shown by a very sharp X-ray rocking curve and an AC susceptibility of __.
262 - The configuration was the same as FIG. 7. The resulting film was used in a resonator (is description desirable?) having a Q over 3000 up to high power limits (about 0 dBm). The film properties included Delta Tc, 1.0K; and Q (15 GHz, 77K), 8669.

Finally, in accordance with a preferred embodiment of this invention, the structure of FIG. 8 is modified in that the clips 170 are placed from the base plate 152 over the top blow off valve 166. This modified arrangement provides a more reproducible seal than other arrangements.

Figure 10:
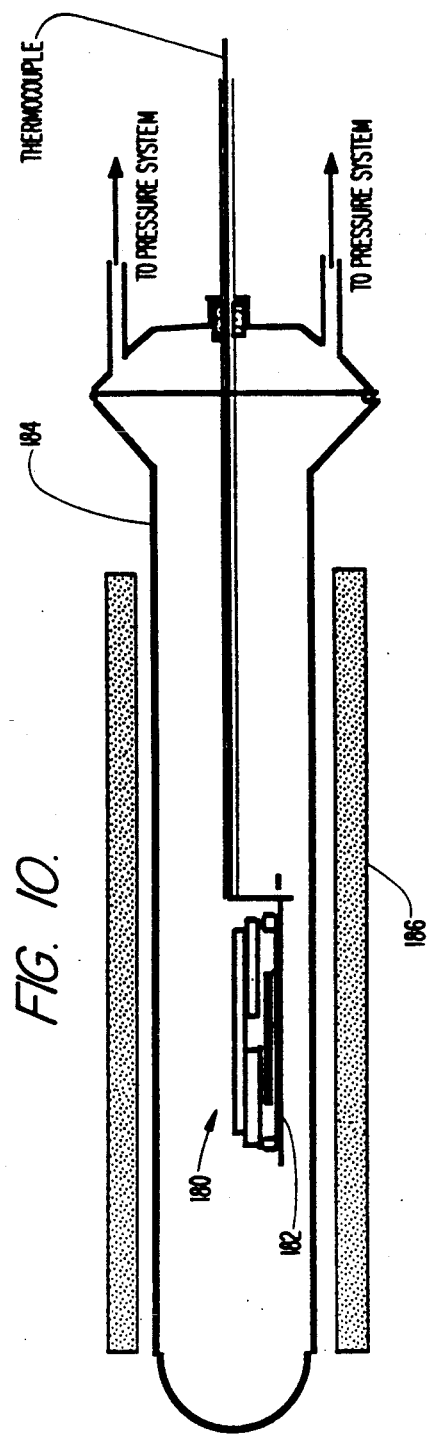
FIG. 10 is a cross-sectional view of the reactor in a quartz tube.

As shown in FIG. 10 the reaction assembly 180 is located on a quartz transport plate 182 which is disposed within a quartz tube 184. The reaction assembly 180 is then disposed within the furnace 186 The system is flushed with pure oxygen to remove contaminants, and the temperature cycle commenced. With respect to these experiments, most runs have been performed at one atmosphere of oxygen and the thallium content of the amorphous deposit, loss rate as a function of temperature, and final weight are selected to give the best morthology and $T_c$ in the finished film. To control the weight loss, these experiments have been performed with slow heating and cooling rates. Typically, 5° per minute has been the typical heating rate.

An example of a typical procedure using the above described equipment is given below. Using a laser ablation technique the following parameters and materials were used:

Substrate Material = LaAlO$_3$ Vendor = AT&T
Beam Energy = 2.2J/cm2 Chamber Pressure = 5 mtorr
Target composition = 8223 Deposition time = 42 min.
Substrate temp. = 25 C. Atmosphere = O$_2$
Film thickness = 1.5 μms
The thermal process per file was as follows:
Ramp 1 = 50 deg/min to 680 C.
Ramp 2 = 25 deg/min to 720 C.
Ramp 3 = 5 deg/min to 780 C. hold for 5 min.
Ramp 4 = 5 deg/min to 860 C. hold for 2 min.
Cool by switching off power to furnace.
The leak dimensions of the groove were 500 μms × 500 μms. The pressure was 760 torr.

The film made from this experiment had a $T_c$ = 101.7 K, with a transition width of 1.6 K. The $R_s$ at 77 K and 10 GHz was 0.2 mohms. The Q factor at 14 GHz was 11,000. The use of this film as a 2.5 GHz resonator in a microstrip configuration gave a Q of 9500 at relatively low power (−65 dBm) and 5500 at relatively high power (−10 dBm).

It is evident from the above results, that superconducting films can be obtained for use in a variety of devices, where the films have high superconducting transition temperatures, good surface resistivity properties, equal or better than copper films, in their performance. Markedly improved epitaxial quality is obtained with various substrates, such as magnesium oxide and lanthanum aluminate. The films exhibit sharp XRD rocking curves and well defined electron channeling patterns were 1 cm$^2$ areas. The films show superior microwave performance at high power. Tl thin film resonators fashioned from thin films into strip line and microwave configurations have significantly higher "Q's" than cryogenically cooled silver resonators at power levels as high as 20 dBm. The resonators exhibited no power dependance over power ranges between −70 and −10 dBm. The power levels at −10 dBm is characteristic of the power levels present in practical passive microwave devices, representing approximately 1 mW of power. In passive microwave devices, employing a stripline or microstrip-configuration resonator, the devices can outperform cryogenic silver by as much as 30 times at 2 GHz and 77 K.

The method is simple, film growth is driven by evaporation of thallous oxide at high temperature and therefore can be done rapidly. The process coupled with the characteristically rapid diffusion kinetics of liquid phase processes, minimizes substrate/film interdiffusion reactions by limiting the process time at high temperature to below about 10 min.

A secondary thallium source is not required, minimizing toxic waste disposal requirements. Compatibility problems of processing thallous oxide in an oxygen atmosphere at high temperature, i.e., corrosion chemical reactivity, are minimized by using sapphire as the reactor. The reactor design is simple and has a very low thermal mass, lending itself to controlled, uniform heating and cooling of the sample.

The use of extremely small reactor volumes guarantees rapid equilibrium between the film and vapor, thereby minimizing lateral composition/morphological gradients in the film. The thermal process geometry appears to be both readily scalable and compatible with current available rapid thermal annealing furnace equipment. The thallous oxide vaporization rate from the film can be controlled by varying the oxygen partial pressure, temperature and the diffusion-limited (leak rate-gapped dimensions) loss rate from the reactor.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A device for producing thallium containing superconductors by thermal processing of a mixture of thallium and copper oxides and remaining metal ion sources, said device comprising:
   first and second plates of a material substantially non-reactive with thallium oxide at elevated temperatures in overlapping relationship;
   a spacer of a material substantially non-reactive with thallium oxide at elevated temperatures, said spacer situated between said first and second plates for sealing and permitting controlled, affirmative the rate of leakage of the vapor phase from said cavity; and
   a cavity defined by said plates and said spacer, which cavity is of a sufficiently small volume to allow for rapid equilibrium between the vapor phase and a liquid phase of said mixture.

2. A device according to claim 1, further comprising a coating of said mixture on a substrate.

3. A device according to claim 2, wherein said substrate is one of said plates.

4. A device according to claim 1, wherein said cavity is formed at least in part in at least one of said plates.

5. A device according to claim 1, further comprising means for compressing said plates and said spacer.

6. A device according to claim 1, further comprising an outlet communicating with said cavity.

7. A device for producing thallium containing superconductors by thermal processing of a mixture of thallium and copper oxides and remaining metal ion sources, said device comprising:
   a first plate of sapphire having a substantially centrally located hollow area;
   a second plate of sapphire in overlapping relationship with said first plate;
   a spacer of a material substantially non-reactive with thallium oxide at elevated temperatures, said spacer situated between said first and second plates for sealing and permitting controlled, affirmative leakage of the vapor phase from said cavity;
   first and second susceptors in heat transfer relationship with said first and second plates, respectively;
   means for maintaining said plates, spacer and susceptors under compression; and
   a cavity comprising said hollow and defined by said plates and said spacer, which cavity is of a sufficiently small volume to allow for rapid equilibrium between the vapor phase and a liquid phase of said mixture.

8. A device according to claim 7, wherein said spacer is a sapphire ring lapped to ensure a close fit between said sapphire plates and said spacer.

9. A device according to claim 7, wherein said compression means is a weighted lever.

10. A device for producing thallium containing superconductors by thermal processing of a mixture of thallium and copper oxides and remaining metal ion sources, said device comprising:
    a first plate of stainless steel having a substantially centrally located hollow area;
    a second plate of stainless steel in overlapping relationship with said first plate;
    a space of a substantially non-thermally conducting material substantially non-reactive with thallium oxide at elevated temperatures;
    first and second gaskets between said spacer and said first and second plates, respectively;
    a cavity comprising said hollow area and defined by said plates, said gaskets and said spacer, which cavity is of a sufficiently small volume to allow for rapid equilibrium between the vapor phase and a liquid phase of said mixture; and
    an outlet in communication with said cavity, exiting said cavity, for controlling the composition and pressure of the vapor phase in said cavity.

11. A device according to claim 10, further comprising:
    a substrate inside said cavity seated on one of said plates;
    a coating of said mixture on said substrate;
    a coating of a thallium source or sink on the opposite plate and inside said cavity; and
    a cover over said thallium source or sink coating of a substantially non-thermally conducting material.

12. A device for producing thallium containing superconductors by thermal processing of a mixture of thallium and copper oxides and remaining metal ion sources, and device comprising:
    a first plate of sapphire having a substantially centrally located hollow area;
    a second plate of sapphire in overlapping relationship with said first plate, wherein one of said plates has a substantially centrally located orifice;
    a cover plate over said orifice having a groove communicating with said orifice and external to the device, thereby permitting controlled, affirmative leakage from the cavity;
    a spacer of a material substantially nonreactive with the thallium oxide at elevated temperatures, said spacer situated between said first and second plates for sealing;
    means for maintaining said plates, spacer and cover plate under compression; and
    a cavity comprising said hollow area and defined by said plates and spacer, which cavity is a sufficiently small volume to allow for rapid equilibrium between the vapor phase and a liquid phase of said mixture.

13. A device according to claim 12, further comprising:
    a substrate seated on the plate opposite said orifice; and
    a coating of said mixture on said plate.

* * * * *